United States Patent [19]

Feng et al.

[11] Patent Number: 5,308,661
[45] Date of Patent: May 3, 1994

[54] PRETREATMENT PROCESS FOR FORMING A SMOOTH SURFACE DIAMOND FILM ON A CARBON-COATED SUBSTRATE

[75] Inventors: Zhu Feng, Albany; Marilee Brewer, Goleta; Ian Brown, Berkeley; Kyriakos Komvopoulos, Orinda, all of Calif.

[73] Assignee: The Regents of the University of California, Oakland, Calif.

[21] Appl. No.: 25,433

[22] Filed: Mar. 3, 1993

[51] Int. Cl.$^5$ .............................................. B05D 3/06
[52] U.S. Cl. .................................. 427/535; 427/533; 427/249; 427/122; 428/408; 423/446
[58] Field of Search ............... 427/535, 533, 249, 122, 427/534; 428/408; 423/446; 156/DIG. 68

[56] References Cited

U.S. PATENT DOCUMENTS 5,169,676 12/1992 Moran et al. ....................... 427/575

OTHER PUBLICATIONS

Feng, Z., et al., "Growth of Diamond Films on Various Carbon Coatings with Microwave Plasma Enhanced CVD" *Publication No. LBL-32744*, Lawrence Berkeley Laboratory, University of California, Berkeley, Calif. 1992, pp. 1–8.

Geis, Michael W., et al., "Diamond Film Semiconductors", *Scientific American*, Oct., 1992, pp. 84–89.

Meilunas, R. J., et al., "Nucleation of Diamond Films on Surfaces Using Carbon Clusters", *Appl. Phys. Lett.*, vol. 59, No. 26, Dec. 23, 1991, pp. 3461–3463.

*Primary Examiner*—Roy V. King
*Attorney, Agent, or Firm*—Paul R. Martin; Kathleen S. Moss; Pepi Ross

[57] ABSTRACT

A process is disclosed for the pretreatment of a carbon-coated substrate to provide a uniform high density of nucleation sites thereon for the subsequent deposition of a continuous diamond film without the application of a bias voltage to the substrate. The process comprises exposing the carbon-coated substrate, in a microwave plasma enhanced chemical vapor deposition system, to a mixture of hydrogen-methane gases, having a methane gas concentration of at least about 4% (as measured by partial pressure), while maintaining the substrate at a pressure of about 10 to about 30 Torr during the pretreatment.

13 Claims, 2 Drawing Sheets

PRETREATMENT PROCESS FOR FORMING A SMOOTH SURFACE DIAMOND FILM ON A CARBON-COATED SUBSTRATE

The invention described herein arose in the course of, or under: Contract No. DE-AC03-SF00098 between the United States Department of Energy and the University of California; and Contract No. MSS-8996309 between the National Science Foundation, Surface Engineering and Tribology Program, and the University of California.

BACKGROUND OF THE INVENTION

1. Field of the Invention

This invention relates to the formation of diamond films on a carbon-coated substrate. More particularly, this invention relates to a process for pretreating a carbon-coated substrate on which the diamond film is to be formed to thereby provide a smooth surface continuous diamond film over the underlying carbon-coated substrate.

2. Description of the Related Art

The development of a process for growth of high quality diamond films on various substrates using a plasma enhanced chemical vapor deposition technique has resulted in the exploration of various applications for use of the resulting outstanding physical properties of this unique material, including use as a hard protective coating, which employs diamond's very high hardness and low friction coefficient in air; as electronic (semiconductor) material, which employs its high resistance and hole mobility; as optical window material, which employs its transparency to visible, infrared, and most ultraviolet light; and as heat sink material, which employs its high thermal conductivity.

However, for all of these applications, a smooth and uniform film is needed because a rough diamond surface can cause mechanical abrasion of adjacent components; large surface light scattering, resulting in low transmission as an optical window; and poor physical contact, resulting in low heat transfer.

Since diamond films prepared by conventional chemical vapor deposition usually have a rough surface, the desired smooth diamond film is conventionally produced by polishing the diamond film after deposition. Such polishing is an effective tool for a thick (and flat) film used as a wear-resistant coating. However, such polishing techniques can cause surface damage and contamination of the film, and are not easily applied to thin films, or to films on substrates of complex geometric shape.

A superior approach to the surface roughness problem has been found to be control of the grain size or nucleation density during the diamond growth phase, since in principle, if the particle size of nucleation seeds can be reduced, and if a high and uniform density of the nucleation sites is maintained, and subsequent growth is uniform on all nuclei, then the surface roughness of the final film should be reduced accordingly.

Thus the problem of decreasing the surface roughness becomes a problem of increasing the diamond nucleation density. The most common technique which has been employed for obtaining high nucleation density of diamond grown on foreign substrates has been to mechanically abrade (scratch) the substrate with diamond powder or paste or other hard abrasive before deposition. However, such mechanical abrasion of the substrate is not compatible with many of the intended uses of the coating material, e.g., for use on microelectronic substrates.

While such mechanical abrasion of the substrate with diamond powder is not desirable for many applications, studies based on the use of this technique have indicated that such substrates scratched with diamond powder result in high diamond nucleation density. This has, in turn, given rise to a less destructive method of increasing the nucleation sites on a substrate, which comprises coating the substrate with carbon particles. However, it has been found that while the presence of carbon particles on the surface of a substrate may, under some circumstances, provide a high density of nucleation sites for subsequent diamond growth, the increased nucleation density is not always accompanied by film uniformity, thus giving rise to non-uniform diamond growth on the substrate.

More recently Meilunas et al., in a paper entitled "Nucleation of Diamond Films on Surfaces Using Carbon Clusters", published on Dec. 23, 1991 by the American Institute of Physics on pages 3461–3463, described a pretreatment of such a carbon ($C_{60}/C_{70}$)-based nucleation layer, which comprises applying a negative voltage bias to the substrate of about 200 to 300 volt, while exposing the substrate to a plasma containing a higher concentration of methane (about 10%) in the methane/hydrogen gas mixture than normally used in the standard diamond deposition process, as well as using a lower pressure (about 15 Torr) during this pretreatment than normally used in the standard diamond deposition process.

While the results reported by Meilunas et al. indicate that such a pretreatment does result in the formation of a high density of nucleation sites for diamond growth, resulting in the formation of continuous diamond films, it would be desirable to provide a simpler pretreatment process in which it would be unnecessary to apply a bias voltage to the substrate during the pretreatment, and more importantly, to use other common carbons rather than exotic carbons such as $C_{60}/C_{70}$ used by Meilunas et al.

SUMMARY OF THE INVENTION

It is, therefore, an object of the invention to provide a process for the pretreatment of a carbon-coated substrate to provide a uniform and high density of nucleation sites thereon for the subsequent growth of a continuous diamond film without the application of a bias voltage to the substrate during the pretreatment and to use common carbon sources such as amorphous carbon and graphitic carbon as diamond nucleation seeding materials.

It is another object of the invention to provide a process for the pretreatment of a carbon-coated substrate, in the absence of a voltage bias on the substrate during the pretreatment, to provide a uniform and high density of nucleation sites thereon for the subsequent deposition of a continuous diamond film which comprises exposing the carbon-coated substrate, in a microwave plasma enhanced chemical vapor deposition system, to a mixture of hydrogen-methane gases, having a higher concentration of methane gas than normally used in the deposition of a diamond film on the substrate, while maintaining the substrate at a lower pressure than normally used in the deposition of a diamond film on the substrate.

It is a further object of the invention to provide a process for the pretreatment of a carbon-coated substrate, in the absence of a voltage bias on the substrate during the pretreatment, to provide a uniform and high density of nucleation sites thereon for the subsequent deposition of a continuous diamond film which comprises exposing the carbon-coated substrate, in a microwave plasma enhanced chemical vapor deposition system, for at least about 10 minutes to a mixture of hydrogen-methane gases, having a partial pressure concentration of at least about 4% methane gas, while maintaining the substrate at a low pressure of about 10 to 30 Torr during the pretreatment.

These and other objects of the invention will be apparent from the following description and accompanying Figures.

DETAILED DESCRIPTION OF THE INVENTION

Figure 1:
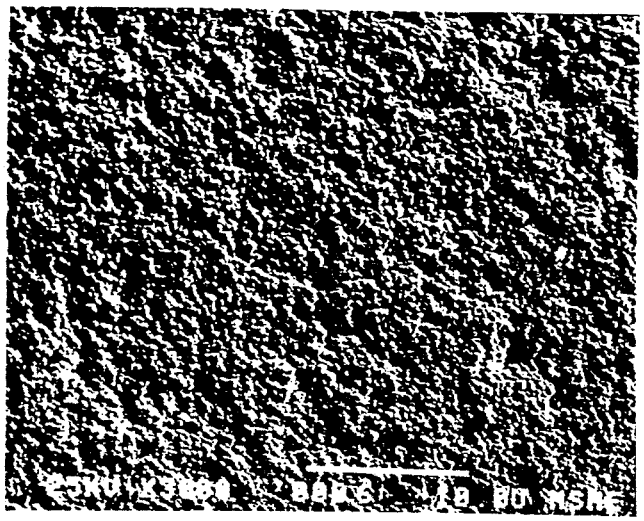
FIG. 1 is a SEM micrograph of a diamond deposition on a silicon substrate which had been previously scratched with 10-$\mu$m diamond powder to flatten the surface followed by polishing with 1-$\mu$m diamond powder to smooth out the deeper scratches.

The invention comprises a pretreatment process for carbon-coated substrates which provides a uniform and high density of nucleation sites thereon for the subsequent growth of a continuous diamond film thereon, wherein a carbon-coated substrate is exposed, in a microwave plasma enhanced chemical vapor deposition system, to a mixture of hydrogen and methane gases, having a higher concentration of methane gas than normally used in the deposition or growth of a diamond film on the substrate, while maintaining the substrate at a lower pressure than normally used in the deposition of a diamond film on the substrate.

The carbon-coated substrate used for the pretreatment, and for the subsequent deposition of the continuous diamond film on the pretreated surface, may comprise any solid surface capable of being coated with a carbon-containing coating. The substrate may be an insulator, a semiconductor, or a conductive material. For example, fused silica, silicon, and copper have all been successfully used as substrates in the pretreatment process.

The carbon-containing coating which is applied to the surface of the substrate prior to the pretreatment may comprise any one of a number of carbon-containing coating materials. For example, fullerene coatings respectively comprising a 9:1 wt. % mixture of $C_{60}$ and $C_{70}$, and a pure $C_{70}$ coating have been successfully used; as have coatings made from amorphous carbon and colloidal graphite having a particle size of approximately 8 nanometers.

The carbon-containing coating may be applied to the substrate by first dispersing (or optionally dissolving in the case of fullerenes) the carbonaceous material in a liquid which serves as a vehicle for application of the carbon coating to the substrate. For convenience, the liquid may be any easily evaporatable liquid. However, the liquid must be compatible with the underlying substrate, i.e., be chemically nonreactive with the underlying substrate material(s).

The carbon-coating may also be applied, in some cases such as the fullerenes, by evaporation of the coating material in powder form, and subsequent deposition of the condensed coating material from the vapor state on the substrate. An amorphous carbon coating may be applied to the substrate by vacuum arc deposition, using a vacuum arc with a graphite cathode to produce a dense carbon plasma which may be directed to the surface of the substrate through a magnetic duct configuration.

No matter how applied, the concentration and thickness of the resultant coating must be sufficient to provide a uniform density or concentration of carbon atoms in the resultant coating on the substrate surface of at least about 10 atoms/$\mu m^2$. The coating thickness will depend on the form of carbon and preparation technique. For amorphous carbon film, it is usually at least 20 nm, and typically will be about 50 nm.

After the substrate is coated with the carbon-containing coating, and after evaporation or other satisfactory removal of any liquid carrier from its surface, the coated substrate is placed (coated surface up) on a stand in a vacuum chamber, e.g., a 1 liter bell jar reactor, which is coupled to a microwave cavity capable of generating and sustaining a microwave plasma in the vacuum chamber. By way of illustration, and not of limitation, the microwave generator may comprise a magnetron capable of generating microwaves of 2.45 GHz at a power level of approximately 800 watts. It will, of course, be understood that the required power level of the microwave generator will vary with the size of the vacuum chamber.

The vacuum chamber is evacuated down to a pressure of from about 0.1 Torr, and it is then filled with argon to a pressure of 1 Torr to 10 Torr, preferably 5 Torr. The microwave generator is energized to generate an argon plasma (light blue) with a magnetron power of 350 watts. At this point, a flow of from about 100 to about 300 standard cubic centimeters per minute (sccm) of hydrogen into the vacuum chamber is then commenced. After the hydrogen plasma is seen (light purple) in the reaction chamber, the argon flow is shut off.

The magnetron power is then increased to about 840 watts. When the temperature reaches a value between 500° and 600° C., preferably 550° C., a flow of from about 4 to about 10 sccm of methane is commenced, while still maintaining the same flow of hydrogen into the vacuum chamber, to provide a methane/hydrogen concentration ratio (expressed as partial pressure percentages) in the gas flow of from about 4% to about 10% methane, preferably from about 5% to about 6% methane. The flow of methane/hydrogen gases into the vacuum chamber, within the above ratio limits, is then maintained for a period of time ranging from a minimum of about 10 minutes up to about 2 hours. Longer periods of time may be used for the pretreatment, but satisfactory results have been obtained within this time period and longer pretreatment periods are, therefore, deemed to be unnecessary.

After the pretreatment time period has expired, the pressure in the vacuum chamber is allowed to rise to about 100 Torr and the flow of methane is reduced until the ratio of methane to hydrogen (expressed as partial pressure percentages) ranges from about 0.15% to under 4% methane, preferably from about 0.5% to about 1% methane.

The continuous diamond film is then deposited on the pretreated substrate for a period of from about 2 to about 8 hours, usually about 4 hours, while maintaining the carbon-coated pretreated substrate at a temperature ranging between about 800° C. and about 900° C. The resulting continuous diamond film deposited on the substrate has a thickness ranging from about 0.1 $\mu$m to about 10 $\mu$m, with a uniform concentration and size of the diamond crystals grown on the surface, indicating a uniformity in the dispersion and density of the nucleation sites resulting from the pretreatment.

To further illustrate the invention, a number of carbon-coated substrates were prepared, respectively using (1) a coating comprising a mixture of $C_{60}/C_{70}$ fullerenes; (2) a $C_{70}$ coating material; (3) an amorphous carbon coating; and (4) colloidal carbon coatings, on the substrates. Prior to the coating, each of the silicon and fused silica substrates were cleaned with aqueous HF (25 Volume %) followed by rinsing in distilled water and then acetone. The copper substrate was cleaned by acetone.

The $C_{60}/C_{70}$ mixture was dissolved in toluene and then applied to a silicon substrate as a liquid coating. The $C_{70}$ coating material was heated as a powder to 650° C. to evaporate the material which was then deposited onto a silicon substrate positioned above the source. The amorphous carbon coating was applied to a silicon substrate using vacuum arc deposition, where a dense carbon plasma was produced and then deposited on the substrate. Colloidal carbon coatings were applied to silicon, fused silica (silicon oxide), and copper substrates by an immersion technique in which substrates were first immersed in an isopropyl alcohol diluted colloidal graphite suspension and then taken out for drying. Thick carbon films were made by multiple immersions.

Each of these coated substrates was then subjected to the pretreatment process of the invention in a vacuum chamber maintained at a pressure of about 20 Torr. In each instance, the substrate was maintained at a temperature of 550° C. during the pretreatment, which lasted for 1 hour in each instance except the silicon substrate coated with the $C_{60}/C_{70}$ mixture where the pretreatment was applied for 10 minutes. In each instance the methane concentration in the methane/hydrogen mixture flowed into the vacuum chamber during the pretreatment was maintained at 5% methane/95% hydrogen (expressed as partial pressure percentages). The microwave generator used to form the plasma in the vacuum chamber was maintained at a power level of 800 watts.

After the pretreatment, a diamond layer was grown on each of the coated substrates, using conventional processing which consisted of a temperature of about 810° C.–830° C., a pressure of about 100 Torr, a hydrogen/methane partial pressure ratio of 99% hydrogen and 1% methane, with a flow rate of about 100 sccm of hydrogen and 1 sccm of methane flowing into the chamber. The plasma was maintained in the vacuum chamber by maintaining the microwave generator at a power level of about 840 watts. This diamond growth process was carried out for 4 hours.

As a comparison, diamond films were also grown on (1) an uncoated silicon substrate; (2) a silicon substrate which had been scratched with 10-$\mu$m diamond powder to flatten the surface followed by polishing with 1-$\mu$m diamond powder to smooth out the deeper scratches; (3) a silicon substrate coated with 0.1 $\mu$m diamond powder in an ethanol suspension, using a spin-coating deposition technique; and (4) a silicon substrate coated with the above-discussed $C_{60}/C_{70}$ fullerene coating, but not thereafter given the pretreatment process of the invention.

The same parameters were utilized for the diamond growth on these substrates as on the carbon-coated pretreated substrates, except that these substrates were not given the pretreatment process of the invention.

In each case the resulting diamond film was examined, using scanning electron microscopy (SEM) to examine the film morphology and to measure the nucleation density of the films, and Raman spectroscopy was used to identify the diamond phase and other carbon components in the deposited film. The Raman spectrometer used a 10-mW 408-nm Ar+ laser with a 30 $\mu$m diameter sampling area.

A SEM micrograph of the uncoated silicon substrate, after carrying out the diamond deposition process, showed very little diamond nucleation on the clean silicon substrate under these conditions.

A SEM micrograph of the diamond deposition on the silicon substrate scratched with diamond dust, on the other hand, showed a very high density of diamond particles of the order of about $10^{10}$ cm$^{-2}$ nucleated on the surface, as shown in FIG. 1. A Raman spectrum of the same substrate shows an intense, sharp diamond peak near 1332 cm$^{-1}$, confirming diamond growth.

An SEM micrograph of the silicon substrate coated with the 0.1-$\mu$m diamond powder dispersion, before the diamond deposition, showed that the diamond particles (coated on the substrate by the dispersion) have a density of the order of $10^9$ cm$^{-2}$. An SEM micrograph taken after the diamond deposition indicated that the particles grew in size while the particle density remained the same, indicating that diamond nucleation took place mainly on diamond particles.

Figure 2:
FIG. 2 is a SEM micrograph of a diamond deposition on a silicon substrate which had been previously coated with a $C_{60}/C_{70}$ fullerene coating, but not subjected to the pretreatment process of the invention prior to the diamond deposition.

An SEM micrograph of the silicon substrate coated with the $C_{60}/C_{70}$ fullerene coating, but not thereafter given the pretreatment process of the invention, showed formation of a non-uniform diamond coating on the surface of the substrate, as shown in FIG. 2.

Each of the samples subjected to the above described pretreatment, in accordance with the invention, i.e., the $C_{60}/C_{70}$ fullerene-coated silicon substrate; the $C_{70}$ fullerene-coated silicon substrate; the amorphous carbon-coated silicon substrate; the colloidal carbon-coated silicon substrate; the colloidal carbon-coated fused silica substrate; and the colloidal carbon-coated copper substrate; resulted in the subsequent formation of a continuous diamond film with high nucleation density and a resultant smooth diamond surface thereon, after the regular diamond deposition process.

Figure 3:
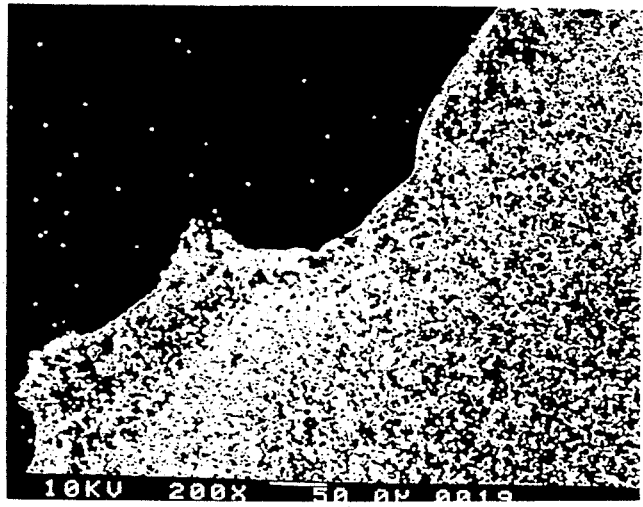
FIG. 3 is a SEM micrograph of a diamond deposition on a silicon substrate is which a portion of the substrate had been previously coated with a $C_{60}/C_{70}$ fullerene coating, and then subjected to the pretreatment process of the invention prior to the diamond deposition.
Figure 4:
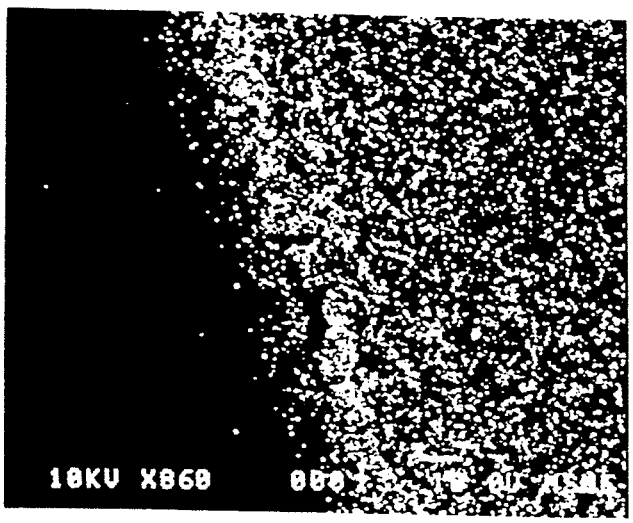
FIG. 4 is a SEM micrograph of a diamond deposition on a silicon substrate in which a portion of the substrate had been previously coated with an amorphous carbon coating, and then subjected to the pretreatment process of the invention prior to the diamond deposition.
Figure 5:
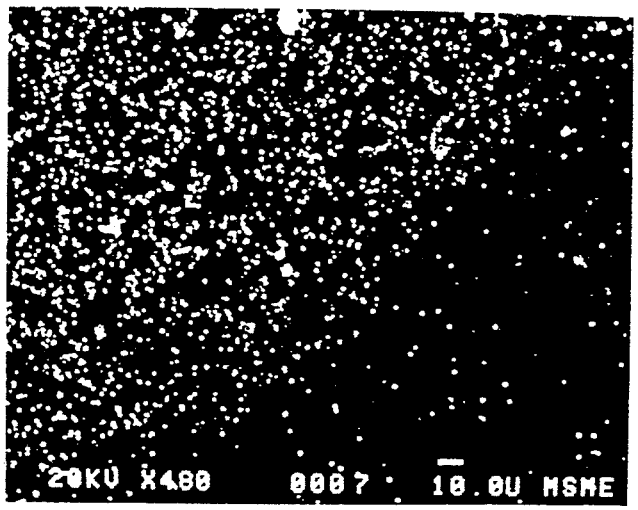
FIG. 5 is a SEM micrograph of a diamond deposition on a fused silica substrate in which a portion of the substrate had been previously coated with a colloidal carbon coating, and then subjected to the pretreatment process of the invention.
Figure 6:
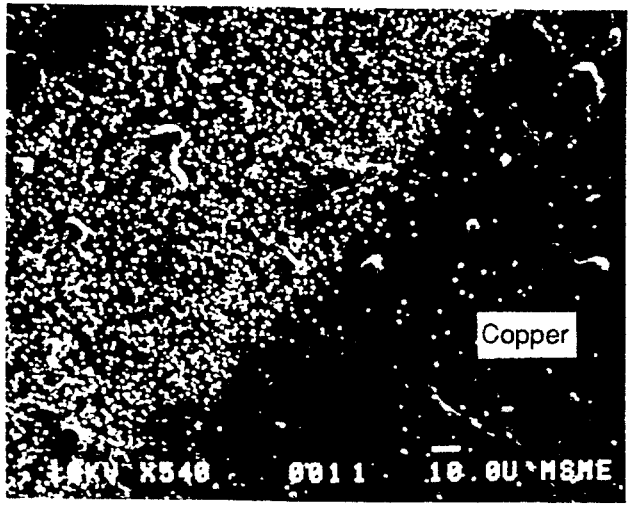
FIG. 6 is a SEM micrograph of a diamond deposition on a copper substrate which had been previously coated with a colloidal carbon coating, and then subjected to the pretreatment process of the invention.

FIG. 3 shows the continuous diamond coating formed on the pretreated $C_{60}/C_{70}$ fullerene-coated silicon substrate; FIG. 4 shows the continuous diamond coating formed on the pretreated amorphous carbon-coated silicon substrate; FIG. 5 shows the continuous diamond coating formed on the pretreated colloidal carbon-coated fused silica substrate; and FIG. 6 shows the continuous diamond coating formed on the pretreated colloidal carbon-coated copper substrate.

Thus, the pretreatment process of the invention, carried out on a carbon-coated substrate at a high methane gas concentration, i.e., at least 4%, as measured by partial pressure ratio of a methane/hydrogen gas mixture, at a low pressure of about 10 to about 30 Torr, and without any electrical bias applied to the substrate, results in the subsequent deposition of a continuous diamond film having a smooth diamond surface thereon, comparable to that obtained by the mechanical abrasion techniques with diamond dust of the prior art.

Having thus described the invention what is claimed is:

1. A process for forming a continuous layer of diamond having a smooth surface on a carbon-coated substrate, which comprises pretreating said carbon-coated substrate, without application of an electrical bias to the substrate, with a methane/hydrogen gas mixture having a concentration of methane of at least about 4% as measured by partial pressure, in a vacuum chamber in the presence of a plasma and at a pressure not exceeding about 30 Torr, and while maintaining said substrate at a temperature of from about 500° C. to about 600° C. during said pretreatment; and then depositing said continuous layer of diamond on the pretreated substrate.

2. The process of claim 1 wherein said pretreatment is carried out for a period of at least about 10 minutes.

3. The process of claim 1 wherein said pretreatment is carried out for a period of from about 10 minutes to about 2 hours.

4. The process of claim 1 wherein said pretreatment is carried out while maintaining the pressure within a range of from about 10 Torr to about 25 Torr.

5. The process of claim 1 wherein said pretreatment is carried out while maintaining said pressure at about 20 Torr.

6. The process of claim 1 wherein said pretreatment is carried out while maintaining said methane concentration in said methane/hydrogen gas mixture within a range of from about 4% to about 10%.

7. The process of claim 6 wherein said pretreatment is carried out while maintaining a methane concentration of from about 5% to about 10% in said methane/hydrogen gas mixture.

8. A process for forming a continuous layer of diamond having a smooth surface on a carbon-coated substrate, which comprises pretreating said carbon-coated substrate, without application of an electrical bias to the substrate, with a hydrogen/methane gas mixture having a concentration of methane ranging from about 5% to about 10%, as measured by partial pressure, in a vacuum chamber in the presence of a plasma and at a pressure of from about 10 Torr to about 25 Torr, and while maintaining said substrate at a temperature within a range of from about 500° C. to about 600° C.; and then depositing said continuous layer of diamond on the pretreated substrate.

9. The process of claim 8 wherein said substrate is maintained at a temperature of from about 550° C. to about 600° C. during said pretreatment.

10. A process for forming a continuous layer of diamond having a smooth surface on a substrate, which comprises the steps in sequence of:
   (a) forming a carbon-containing coating on said substrate;
   (b) pretreating said carbon-coated substrate, without application of an electrical bias to said substrate, for a period of at least about 10 minutes with a methane/hydrogen gas mixture having a concentration of methane of from about 4% to about 10%, as measured by partial pressure, in a vacuum chamber in the presence of a plasma and at a pressure ranging from about 10 Torr to about 30 Torr, while maintaining said substrate at a temperature within a range of from about 550° C. to about 600° C.; and
   (c) depositing said continuous layer of diamond on the pretreated substrate.

11. The process of claim 10 wherein said pretreatment is carried out while maintaining the pressure within a range of from about 10 Torr to about 25 Torr.

12. The process of claim 11 wherein said pretreatment is carried out while maintaining said pressure at about 20 Torr.

13. The process of claim 10 wherein said pretreatment is carried out while maintaining a methane concentration of from about 5% to about 10% in said methane/hydrogen gas mixture.

* * * * *